United States Patent
Sugawara et al.

(10) Patent No.: US 12,107,158 B2
(45) Date of Patent: Oct. 1, 2024

(54) SIC-MOSFET

(71) Applicant: Mitsubishi Electric Corporation, Tokyo (JP)

(72) Inventors: Katsutoshi Sugawara, Tokyo (JP); Yasuhiro Kagawa, Tokyo (JP); Yutaka Fukui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 394 days.

(21) Appl. No.: 17/456,250

(22) Filed: Nov. 23, 2021

(65) Prior Publication Data

US 2022/0293783 A1  Sep. 15, 2022

(30) Foreign Application Priority Data

Mar. 9, 2021 (JP) ................. 2021-037173

(51) Int. Cl.
*H01L 29/78* (2006.01)
*H01L 29/06* (2006.01)
(Continued)

(52) U.S. Cl.
CPC ...... *H01L 29/7805* (2013.01); *H01L 29/0623* (2013.01); *H01L 29/0634* (2013.01);
(Continued)

(58) Field of Classification Search
CPC ............. H01L 29/0615; H01L 29/0619; H01L 29/0623; H01L 29/0634; H01L 29/0692;
(Continued)

(56) References Cited

U.S. PATENT DOCUMENTS

| 2007/0045776 A1 | 3/2007 | Kunori et al. |
| 2007/0069323 A1 | 3/2007 | Kunori et al. |
| 2011/0291110 A1* | 12/2011 | Suzuki ............... H01L 29/0878 257/77 |

FOREIGN PATENT DOCUMENTS

| JP | 2005-197439 A | 7/2005 |
| JP | 2005-285984 A | 10/2005 |

(Continued)

OTHER PUBLICATIONS

An Office Action; "Notice of Reasons for Refusal," mailed by the Japanese Patent Office on May 21, 2024, which corresponds to Japanese Patent Application No. 2021-037173 and is related to U.S. Appl. No. 17/456,250; with English language translation.

(Continued)

*Primary Examiner* — Fazli Erdem

(74) *Attorney, Agent, or Firm* — Studebaker & Brackett PC

(57) ABSTRACT

An object of the present disclosure is to suppress decrease in withstand voltage and increase in ON voltage and to increase body diode current. An SiC-MOSFET includes: a source region formed on a surface layer of a base region; a gate electrode facing a channel region which is a region of the base region sandwiched between a drift layer and the source region via a gate insulating film; a source electrode having electrically contact with the source region; and a plurality of first embedded regions of a second conductivity type formed adjacent to a lower surface of the base region. The plurality of first embedded regions are formed immediately below at least both end portions of the base region, and three or more first embedded regions are formed to be separated from each other.

13 Claims, 6 Drawing Sheets

(51) Int. Cl.
*H01L 29/10* (2006.01)
*H01L 29/16* (2006.01)

(52) U.S. Cl.
CPC ...... *H01L 29/1095* (2013.01); *H01L 29/1608* (2013.01); *H01L 29/7811* (2013.01)

(58) Field of Classification Search
CPC ............. H01L 29/1095; H01L 29/1608; H01L 29/41766; H01L 29/7805; H01L 29/7811; H01L 29/7831
USPC .......................................................... 257/77
See application file for complete search history.

(56) References Cited

FOREIGN PATENT DOCUMENTS

| | | |
|---|---|---|
| JP | 2014-192191 A | 10/2014 |
| JP | 2015-073051 A | 4/2015 |
| JP | 2015-141920 A | 8/2015 |
| JP | 2017-191817 A | 10/2017 |

OTHER PUBLICATIONS

An Office Action; "Notice of Reasons for Refusal," mailed by the Japanese Patent Office on February 13, 2024, which corresponds to Japanese Patent Application No. 2021-037173 and is related to U.S. Appl. No. 17/456,250; with English language translation.

\* cited by examiner

F I G. 1
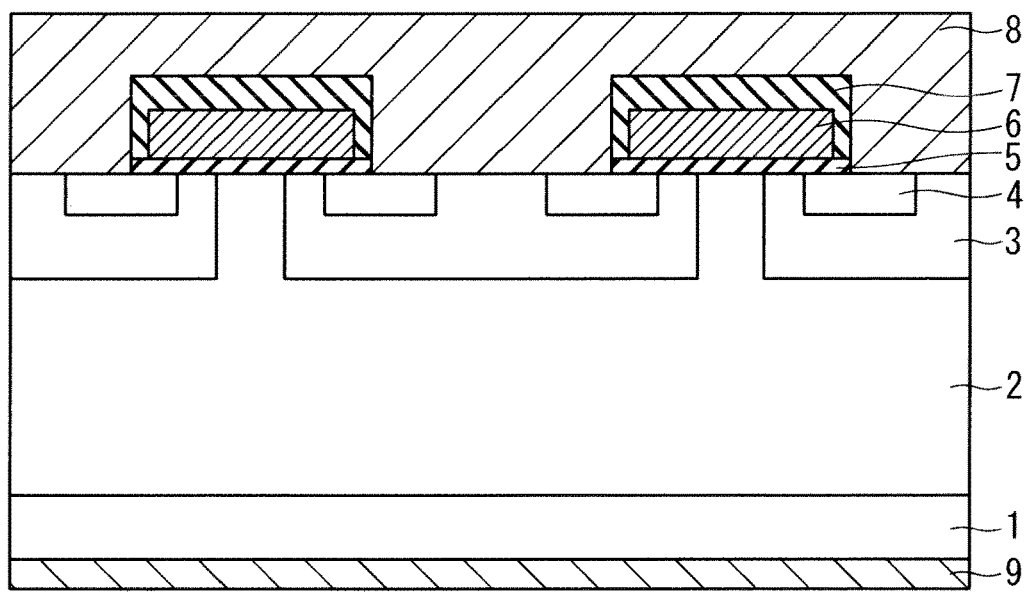
F I G. 2
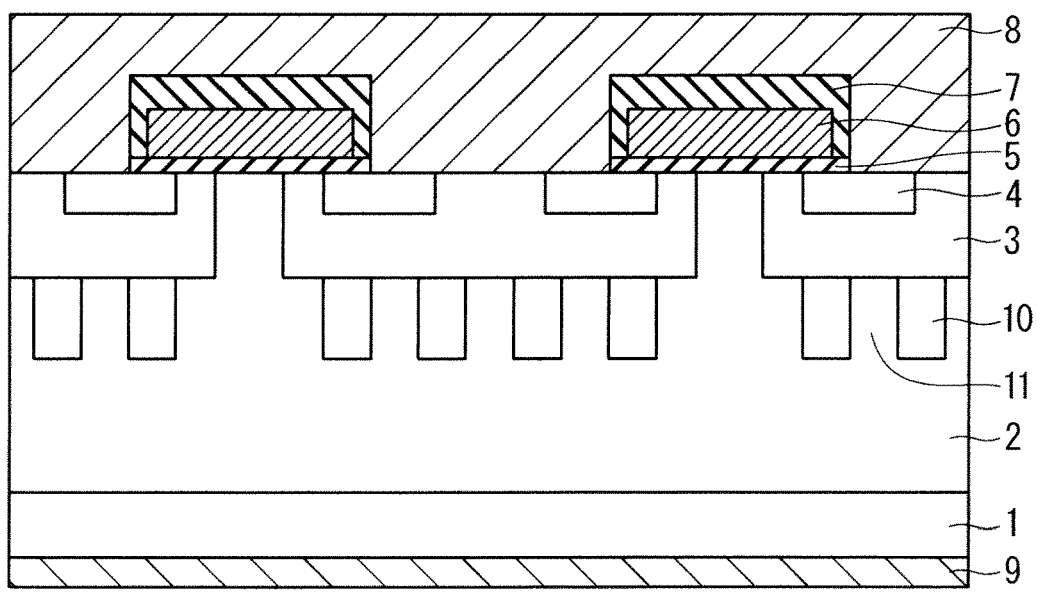

SIC-MOSFET

BACKGROUND OF THE INVENTION

Field of the Invention

The present disclosure relates to an SiC-MOSFET.

Description of the Background Art

Widely used in a power electronic apparatus is an insulated gate type semiconductor device such as an insulated gate bipolar transistor (IGBT) or a metal oxide semiconductor field effect transistor (MOSFET) as a switching element controlling a power supply to a load such as a motor.

There is a high degree of expectation in applying the MOSFET or the IGBT using a wide bandgap semiconductor such as silicon carbide (SiC) to a technical field dealing with high voltage of substantially 1 kV or more as a future switching element. Examples of the wide bandgap semiconductor include a gallium nitride series material and diamond in addition to silicon carbide.

In a MOSFET having a vertical structure, a reverse pn diode referred to as a body diode is formed by a pn junction made up of an n-type drift layer and a p-type base region. The body diode is used, thus an external diode parallelly connected to the MOSFET can be omitted, and the number of elements in a circuit can be reduced. However, known is that when current (referred to as "body diode current" hereinafter) flows in the body diode of the MOSFET applying SiC to a semiconductor material (referred to as "SiC-MOSFET" hereinafter), a stacking fault in a crystal extends by energy generated when an electron-hole pair is recombined. The stacking fault functions as a high resistance layer, thus when it extends, characteristics of the MOSFET and the body diode are deteriorated. Accordingly, the extension of the stacking fault needs to be suppressed to use the body diode of the SiC-MOSFET.

Most of the stacking fault extending due to the body diode current is derived from a substrate. 99% or more of the fault in the substrate is converted into a harmless fault at an interface between the substrate and a drift layer, and does not extend into the drift layer. However, when the body diode current increases and the hole reaches the interface between the drift layer and the substrate, a large number of stacking faults extends from the fault in the substrate as a starting point. The stacking fault functions as a high resistance layer, thus when it extends, characteristics of the MOSFET and the body diode are significantly deteriorated. The hole implanted into the drift layer serves as a minority carrier in the drift layer, thus a depth in which the hole reaches is subject to a lifetime of the minority carrier.

In the meanwhile, known is a technique of providing a Schottky barrier diode (SBD) in a MOSFET and flowing diode current into the SBD. According to this configuration, rising voltage of the SBD provided in parallel to a body diode is smaller than rising voltage in a pn junction of an SiC constituting the body diode, thus the diode current in an OFF state of the MOSFET flows not into the body diode but into the SBD. The current flowing in the SBD is electron current in which no hole intervenes, thus the extension of the stacking fault caused by the hole does not occur, and characteristics of the MOSFET, for example, are not also deteriorated. However, when the diode current increases to some degree, the body diode operates and hole current flows. The SBD is provided in a unit cell, thus a region of the MOSFET decreases. By these reasons, there is a problem that ON voltage increases.

Japanese Patent Application Laid-Open No. 2005-285984 proposes a configuration that a plurality of p-type regions are additionally provided below a p-type base region in the unit cell of the MOSFET to be adjacent thereto. According to the configuration of Japanese Patent Application Laid-Open No. 2005-285984, a lifetime of the implanted hole decreases in a region of a drift layer sandwiched between the p-type regions, thus the number of holes reaching an interface between the drift layer and a substrate can be reduced.

SUMMARY

The configuration of Japanese Patent Application Laid-Open No. 2005-285984 does not include an additional p-type region below an end portion of the p-type base region (paragraph 0045), thus there is a problem that withstand voltage decreases. The reason is that there is concern that when a width of the n-type region adjacent to the end portion of the p-type base region is large, a depletion layer does not sufficiently extend but an electrical field is concentrated, and withstand voltage decreases.

An object of a technique of the present disclosure is to suppress decrease in withstand voltage and increase in ON voltage and to increase body diode current.

An SiC-MOSFET according to the present disclosure includes an SiC substrate of a first conductivity type, a drift layer of a first conductivity type, a base region of a second conductivity type, a source region of a first conductivity type, a gate electrode, a source electrode, and a plurality of first embedded regions of a second conductivity type. The drift layer is formed on an SiC substrate. The base region is formed on a surface layer of the drift layer. The source region is formed on a surface layer of the base region. The gate electrode faces a channel region which is a region of the base region sandwiched between the drift layer and the source region via a gate insulating film. The source electrode has electrically contact with the source region. The plurality of first embedded regions are formed adjacent to a lower surface of the base region. The plurality of first embedded regions are formed immediately below at least both end portions of the base region, and three or more first embedded regions are formed to be separated from each other.

According to the SiC-MOSFET according to the present disclosure, a lifetime of the hole decreases in the region of the drift layer between the first embedded regions, thus the number of holes reaching an interface between the drift layer and the substrate can be reduced, and an extension of a stacking fault can be suppressed. Accordingly, body diode current can be increased. The first embedded region is formed immediately below the both end portions of the base region, thus decrease in the withstand voltage is suppressed. A conduction route of the MOSFET does not change even when the first embedded region is provided, thus increase in ON voltage does not occur.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of an SiC-MOSFET according to a first comparison example of an embodiment 1.

FIG. 2 is a cross-sectional view of an SiC-MOSFET according to a second comparison example of the embodiment 1.

DESCRIPTION OF THE PREFERRED EMBODIMENTS

Figure 3:
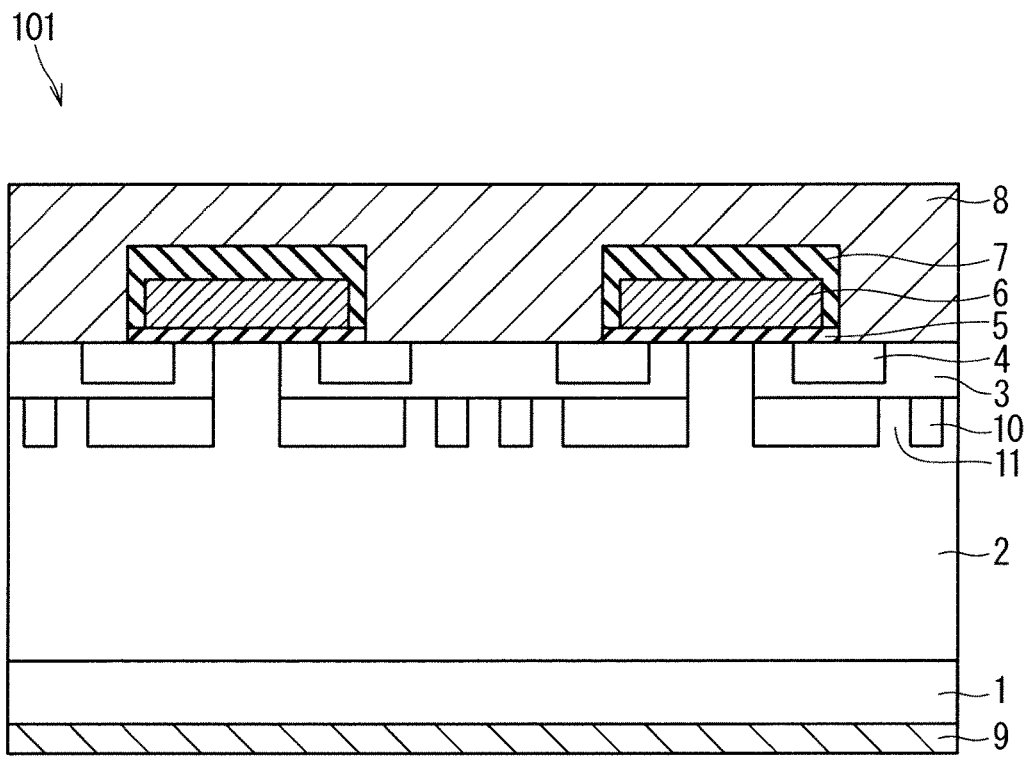
FIG. 3 is a cross-sectional view of an SiC-MOSFET according to the embodiment 1.

Configurations of various SiC-MOSFETs are described hereinafter, however, an n type or a p type in a constituent element of each SiC-MOSFET may be an opposite conductivity type.

A. Embodiment 1

A-1. Comparison Example

FIG. 1 is a cross-sectional view of an SiC-MOSFET 151 according to a first comparison example of an embodiment 1. The SiC-MOSFET 151 is a MOSFET having a vertical structure. The SiC-MOSFET 151 includes an n-type SiC substrate 1, an n-type drift layer 2, a p-type base region 3, an n-type source region 4, a gate insulating film 5, a gate electrode 6, an interlayer insulating film 7, a source electrode 8, and a drain electrode 9. The n-type drift layer 2 is formed on an upper surface of the SiC substrate 1. The p-type base region 3 is formed on a surface layer of the drift layer 2. The n-type source region 4 is formed on a surface layer of the base region 3. A portion of the surface layer of the base region 3 sandwiched between the drift layer 2 and the source region 4 functions as a channel region. The gate insulating film 5 is formed on the channel region, and the gate electrode 6 is formed thereon. That is to say, the gate electrode 6 is formed in a position facing the channel region via the gate insulating film 5. Interlayer insulating film 7 covers a side surface and an upper surface of the gate electrode 6. The source electrode 8 is formed to cover the source region 4, the base region 3, and the interlayer insulating film 7. The source electrode 8 has contact with an upper surface of the base region 3 where the source region 4 other than the channel region is not formed. The drain electrode 9 is formed on a lower surface of the SiC substrate 1.

In the SiC-MOSFET 151, a reverse pn diode referred to as a body diode is formed by a pn junction made up of the n-type drift layer 2 and the p-type base region 3. The body diode is used, thus an external diode parallelly connected to the SiC-MOSFET 151 can be omitted, and the number of elements in a circuit can be reduced. However, when the body diode current flows in the SiC-MOSFET, a stacking fault in a crystal extends by energy generated when an electron-hole pair is recombined, and deteriorates characteristics of the MOSFET and the body diode. Accordingly, the extension of the stacking fault needs to be suppressed to use the body diode of the SiC-MOSFET.

FIG. 2 is a cross-sectional view of an SiC-MOSFET 152 according to a second comparison example 2 of the embodiment 1. The SiC-MOSFET 152 is different from the SiC-MOSFET 151 according to the first comparison example in that the plurality of p-type first embedded regions 10 are provided adjacent to a lower surface of the base region 3. The plurality of first embedded regions 10 are provided for one base region 3. The region of the drift layer 2 sandwiched between the two first embedded regions 10 adjacent to each other is referred to as an n-type region 11. According to the SiC-MOSFET 152, a lifetime of a hole implanted in the n-type region 11 decreases, thus the number of holes reaching an interface between the drift layer 2 and the SiC substrate 1 is reduced. However, the first embedded region 10 is not provided below an end portion of the base region 3, thus there is a problem that withstand voltage decreases. The reason is that there is concern that when a width of the n-type region adjacent to the end portion of the base region 3 is large, a depletion layer does not sufficiently extend but an electrical field is concentrated, and the withstand voltage decreases.

A-2. Configuration

FIG. 3 is a cross-sectional view of an SiC-MOSFET 101 according to the embodiment 1. The SiC-MOSFET 101 is different from an SiC-MOSFET 102 according to the second comparison example in that the first embedded region 10 is also provided immediately below the end portion of the base region 3.

In the SiC-MOSFET 151 according to the first comparison example, the body diode current flows from the whole base region 3 including a portion located below the source electrode 4 to the drift layer 2. A lifetime of the hole in the drift layer 2 is constant.

In the meanwhile, in the SiC-MOSFET 101, a lifetime of the hole decreases around the first embedded region 10. Thus, even when the body diode current which is the same as that in the SiC-MOSFET 151 according to the first comparison example flows in the SiC-MOSFET 101, some of the holes flows from the base region 3 to the n-type region 11 are recombined in the n-type region 11. As a result, the holes reaching the interface between the drift layer 2 and the SiC substrate 1 decrease in number. That is to say, the SiC-MOSFET 101 can flow larger body diode current without an occurrence of a fault extension than the SiC-MOSFET 151 according to the first comparison example.

The effect of reducing the lifetime of the hole occurs around the first embedded region 10. The reason is that the holes are recombined in the n-type region 11 sandwiched between the first embedded region 10, thus hardly reach the drift layer 2 on a lower side. Accordingly, an interval of the first embedded regions 10 adjacent to each other, that is to say, a width of the n-type region 11 is preferably small. However, an area ratio of the n-type region 11 to the base region 3 decreases, the holes flow from the first embedded region 10 to the drift layer 2 is dominant over the holes flowing from the n-type region 11 to the drift layer 2, thus the n-type region 11 needs to have a certain degree of width. Accordingly, the width of the n-type region 11 is preferably equal to or larger than 0.4 μm and equal to or smaller than 4.0 μm. In the meanwhile, when the width of the first embedded region 10 increases, the holes flowing from the first embedded region 10 to the drift layer 2 increase in number. Thus, the width of the first embedded region 10 is preferably equal to or larger than half and equal to or smaller than twice the width of the n-type region 11.

Although depending on the width of the base region 3, two or more n-type regions 11 are preferably provided for one base region 3. In other words, three or more first embedded regions 10 are preferably provided for one base region 3. At this time, the width of the first embedded region 10 and the width of the n-type region 11 may be different from each other. Thus, as illustrated in FIG. 3, the width of the first embedded region 10 located immediately below the both end portions of the base region 3 may be larger than the width of the first embedded region 10 which is not located immediately below the both end portions of the base region 3.

A portion of the base region 3 or the source region 4 having contact with the source electrode 8 is referred to as a source contact region. A volume of flow of the holes is large immediately below the source contact region, particularly in a center portion thereof. Accordingly, in terms of the first embedded region 10 immediately below the source contact region, it is also applicable that the width of the first embedded region 10 located in a center portion is set to be narrowest to increase an effect of eliminating the holes, and the width of the first embedded region 10 is increased toward an outer side from the center portion. The first embedded regions 10 may be disposed at regular intervals for one base region 3. The first embedded regions 10 are disposed at regular intervals, thus achieved is an effect that the body diode current evenly flows from the first embedded region 10, and current characteristics are stabilized.

As a depth of the n-type region 11 gets larger, a distance at which the holes travel in a region where the holes have a short lifetime increases. Thus, a ratio of the depth of the first embedded region 10 to the depth of the base region 3 is at least equal to or larger than 1.2, and is preferably equal to or larger than 1.5. The depth of the first embedded region 10 located immediately below the end portion of the base region 3 is the same as the depth of the other first embedded region 10, thus the withstand voltage increases.

As illustrated in FIG. 3, in the case where the n-type region 11 is also formed immediately below the source region 4, there is concern that when the width of the n-type region 11 is large, the depletion layer does not sufficiently extend but the electrical field is concentrated, and the withstand voltage decreases. Thus, the width of the n-type region 11 is preferably small. In this case, the width of the n-type region 11 may be smaller than "equal to or larger than 0.4 μm and equal to or smaller than 4.0 μm" described above. In the manner similar to the above description, a ratio of the depth of the first embedded region 10 to the depth of the base region 3 in this case is also equal to or larger than 1.2, and is preferably equal to or larger than 1.5.

As an impurity concentration of the first embedded region 10 gets larger, the effect of reducing the lifetime of the hole increases. However, if the impurity concentration of the first embedded region 10 increases, an electrical field applied to a lower portion of the first embedded region 10 increases when the SiC-MOSFET 101 enters an OFF state and high voltage is maintained, thus attention is needed in increasing the impurity concentration.

The plurality of first embedded regions 10 need to be provided immediately below the base region 3 because of a structure of sandwiching the n-type region 11 therebetween. Examples of a planar shape of the unit cell include a lattice form of a rectangular shape, a hexagonal shape, or a circular shape or a stripe shape. When the planar shape of the unit cell is the lattice form, the planar shape of the first embedded region 10 may be a concentric shape or a stripe shape. When the planar shape of the unit cell is the stripe form, the first embedded region 10 may be disposed to be parallel to or perpendicular to a longitudinal direction of the stripe of the unit cell. The first embedded region 10 may be disposed in a pattern in which a concentric pattern is periodically repeated along the longitudinal direction of the stripe of the unit cell.

A-3. Modification Example

Figure 4:
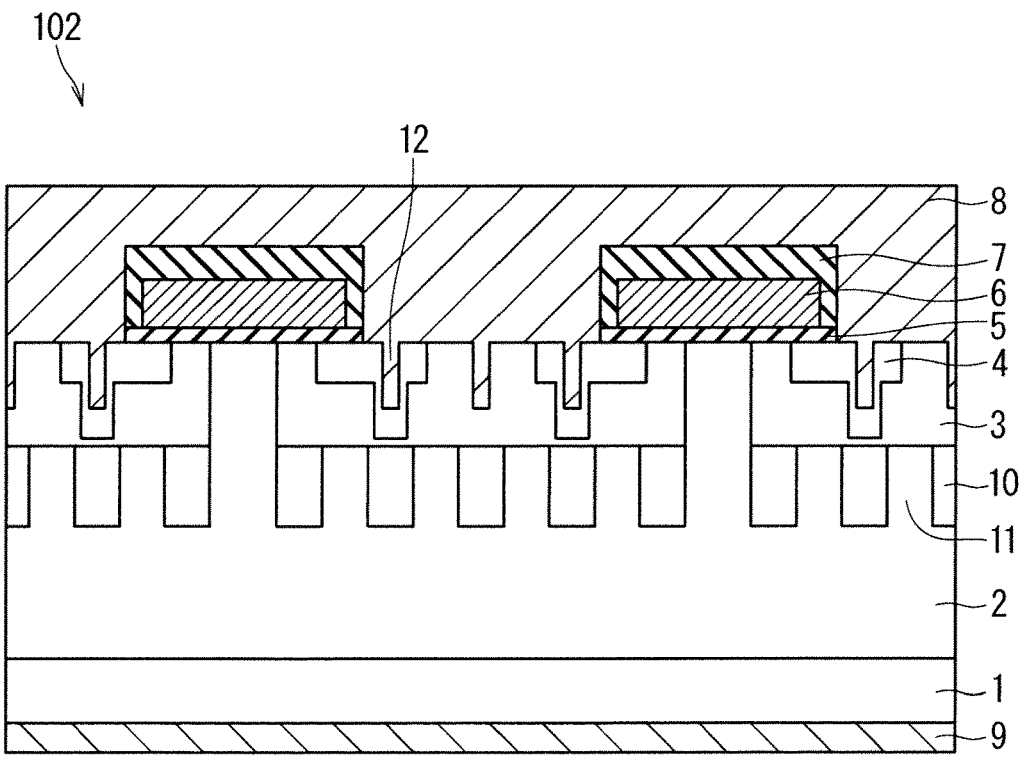
FIG. 4 is a cross-sectional view of an SiC-MOSFET according to a modification example of the embodiment 1.

FIG. 4 is a cross-sectional view of an SiC-MOSFET 102 according to a modification example of the embodiment 1. In the SiC-MOSFET 102, a concave portion 12 is formed in an upper surface of the source region 4 and a source contact portion of the base region 3, and the source electrode 8 is put into the concave portion 12. Then, the first embedded region 10 is formed below the end portion of the base region 3 and below the concave portion 12. According to the SiC-MOSFET 102 having the concave portion 12, the first embedded region 10 can be formed using a mask for forming the base region 3, thus an effect of reducing the mask is achieved.

There is a possibility that the first embedded region 10 is separated from the base region 3 depending on the relationship between the depth of the concave portion 12 and the depth of the first embedded region 10. Even in such a case, the first embedded region 10 is preferably grounded. When the source electrode 8 is embedded into the concave portion 12 as illustrated in FIG. 4, the first embedded region 10 can be grounded. It is also applicable that a part of or a whole sidewall of the concave portion 12 is the p type and the base region 3 and the first embedded region 10 are connected to each other.

A-4. Effect

The SiC-MOSFET according to the embodiment 1 includes: the SiC substrate 1 of the first conductivity type; the drift layer 2 of the first conductivity type formed on the SiC substrate 1; the base region 3 of the second conductivity type formed on a surface layer of the drift layer 2; the source region 4 of the first conductivity type formed on the surface layer of the base region 3; the gate electrode 6 facing the channel region which is the region of the base region 3 sandwiched between the drift layer 2 and the source region 4 via the gate insulating film 5; the source electrode 8 having electrically contact with the source region 4; and the plurality of first embedded regions 10 of the second conductivity type formed adjacent to the lower surface of the base region 3. The plurality of first embedded regions 10 are formed immediately below at least both end portions of the base region 3, and three or more first embedded regions 10 are formed to be separated from each other. The lifetime of the hole decreases in the region of the drift layer 2 between the first embedded regions 10, thus the number of holes reaching the interface between the drift layer 2 and the SiC substrate 1 can be reduced, and the extension of the stacking fault can be suppressed. Accordingly, body diode current can be increased. The first embedded region 10 is formed immediately below the both end portions of the base region 3, thus decrease in the withstand voltage is suppressed. The conduction route of the MOSFET does not change even when the first embedded region 10 is provided, thus increase in ON voltage does not occur.

B. Embodiment 2

B-1. Comparison Example

Figure 5:
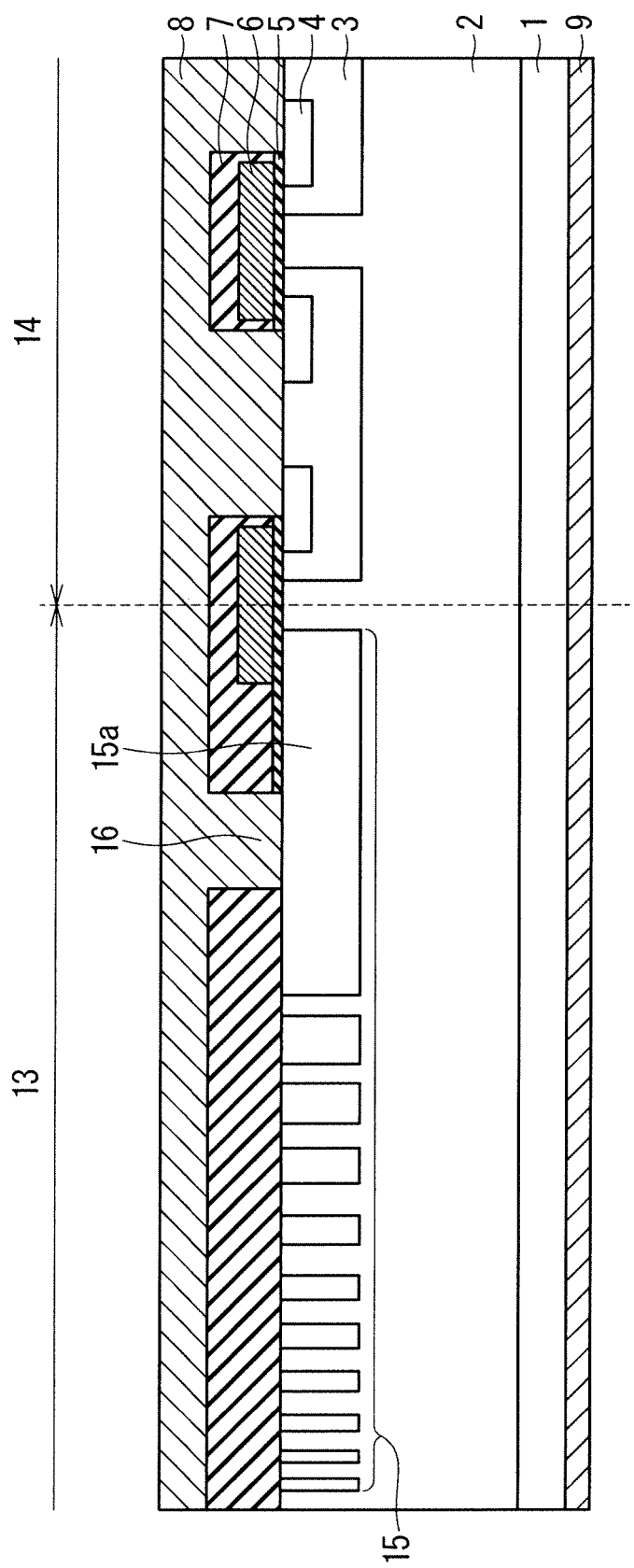
FIG. 5 is a cross-sectional view of an SiC-MOSFET according to a comparison example of an embodiment 2.

FIG. 5 is a cross-sectional view of an SiC-MOSFET 251 according to a comparison example of an embodiment 2.

The SiC-MOSFET 251 includes an active region 14 having a unit cell operating as a MOSFET and an outer peripheral region 13 on an outer side of the active region 14. A configuration of the active region 14 of the SiC-MOSFET 251 is similar to that of the SiC-MOSFET 151 according to the first comparison example of the embodiment 1. The SiC substrate 1, the drift layer 2, the source electrode 8, and the drain electrode 9 are common in the active region 14 and the outer peripheral region 13.

A plurality of guard rings 15 are provided in the surface layer of the drift layer 2 in the outer peripheral region 13. The guard rings 15 are p-type regions, and are concentrically disposed to surround the active region 14. A width of each guard ring 15 gradually decreases from an inner side toward an outer side of the outer peripheral region 13. The gate electrode 6 and a gate pad or a field oxide film, for example, are provided in the outer peripheral region 13 in some cases depending on the configuration of the SiC-MOSFET.

In the SiC-MOSFET 251, current referred to as displacement current occurs in accordance with an expansion and contraction of a depletion layer generated in the drift layer 2 and the guard ring 15 at a time of switching operation. When potential in the guard ring 15 is increased by this current, a potential difference with the source electrode 8 or the gate electrode 6 increases, and the field insulating film, the interlayer insulating film 7, or the gate insulating film 5 provided therebetween is broken. Thus, a guard ring 15a which is the guard ring 15 on the innermost peripheral side is provided with a portion having electrically contact with the source electrode 8, that is to say, a source contact 16. The guard ring 15a having the source contact 16 also operates as a body diode, thus has a problem of the extension of the stacking fault due to the body diode current.

B-2. Configuration

Figure 6:
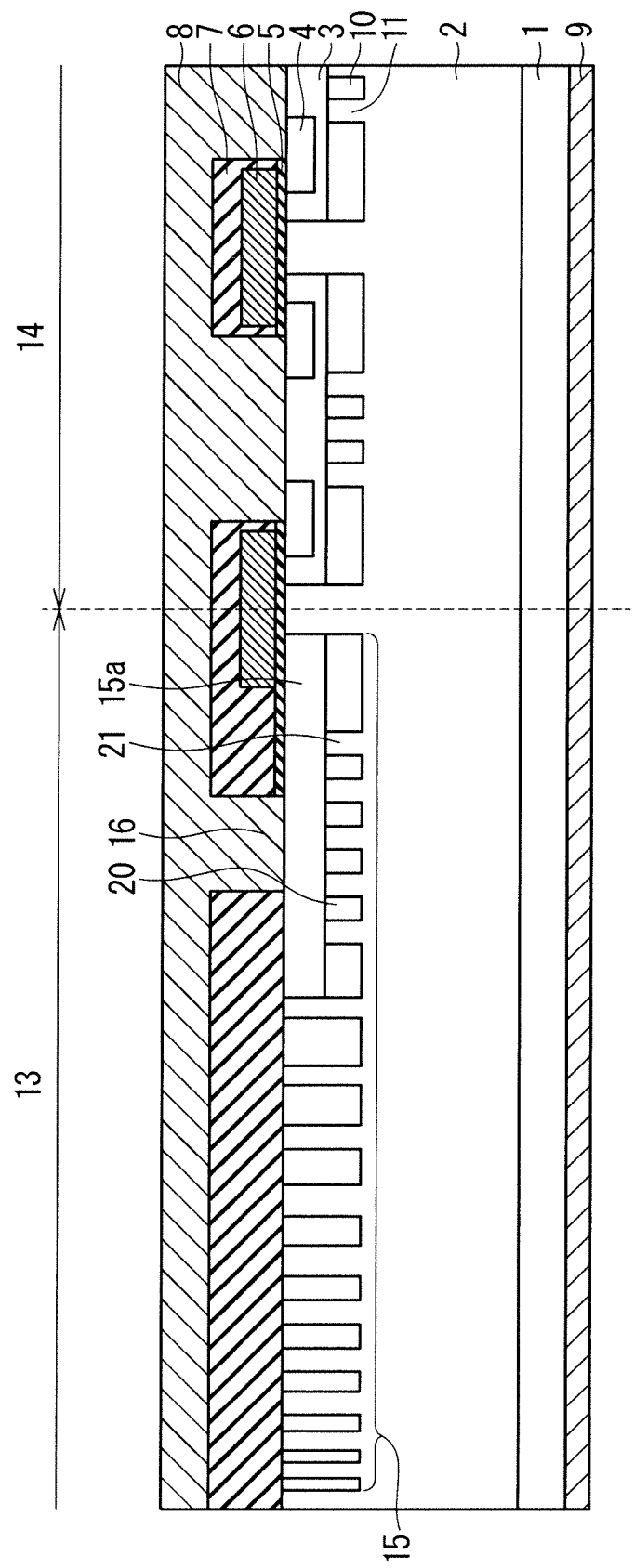
FIG. 6 is a cross-sectional view of an SiC-MOSFET according to the embodiment 2.

FIG. 6 is a cross-sectional view of an SiC-MOSFET 201 according to the embodiment 2. The active region 14 of the SiC-MOSFET 201 has a configuration similar to the SiC-MOSFET 101 according to the embodiment 1. The outer peripheral region 13 of the SiC-MOSFET 201 is different from the outer peripheral region 13 of the SiC-MOSFET 251 according to the comparison example in that a plurality of p-type second embedded regions 20 are provided below the guard ring 15a on the innermost peripheral side to be adjacent thereto. A region of the drift layer 2 sandwiched between two second embedded regions 20 adjacent to each other is referred to as an n-type region 21.

In FIG. 6, the second embedded region 20 is formed not only immediately below the source contact 16 but also below both end portions of the guard ring 15a. However, the second embedded region 20 may be provided only immediately below the source contact 16. As with the description of the first embedded region 10 and the n-type region 11 in the embodiment 1, the second embedded region 20 is provided, thus the lifetime of the hole in the n-type region 21 can be reduced.

A width, a depth, and an impurity concentration of the second embedded region 20 are similar to those of the first embedded region 10. The two or more n-type regions 21 are preferably provided for the guard ring 15a. In other words, three or more second embedded regions 20 are preferably provided for the guard ring 15a.

The second embedded region 20 of the outer peripheral region 13 may have the same depth as the first embedded region 10 of the active region 14. The depths of them are the same as each other, thus withstand voltage is increased. The depth of the second embedded region 20 of the outer peripheral region 13 may be gradually larger from the outer side toward a side of the active region 14.

B-3. Modification Example

Figure 7:
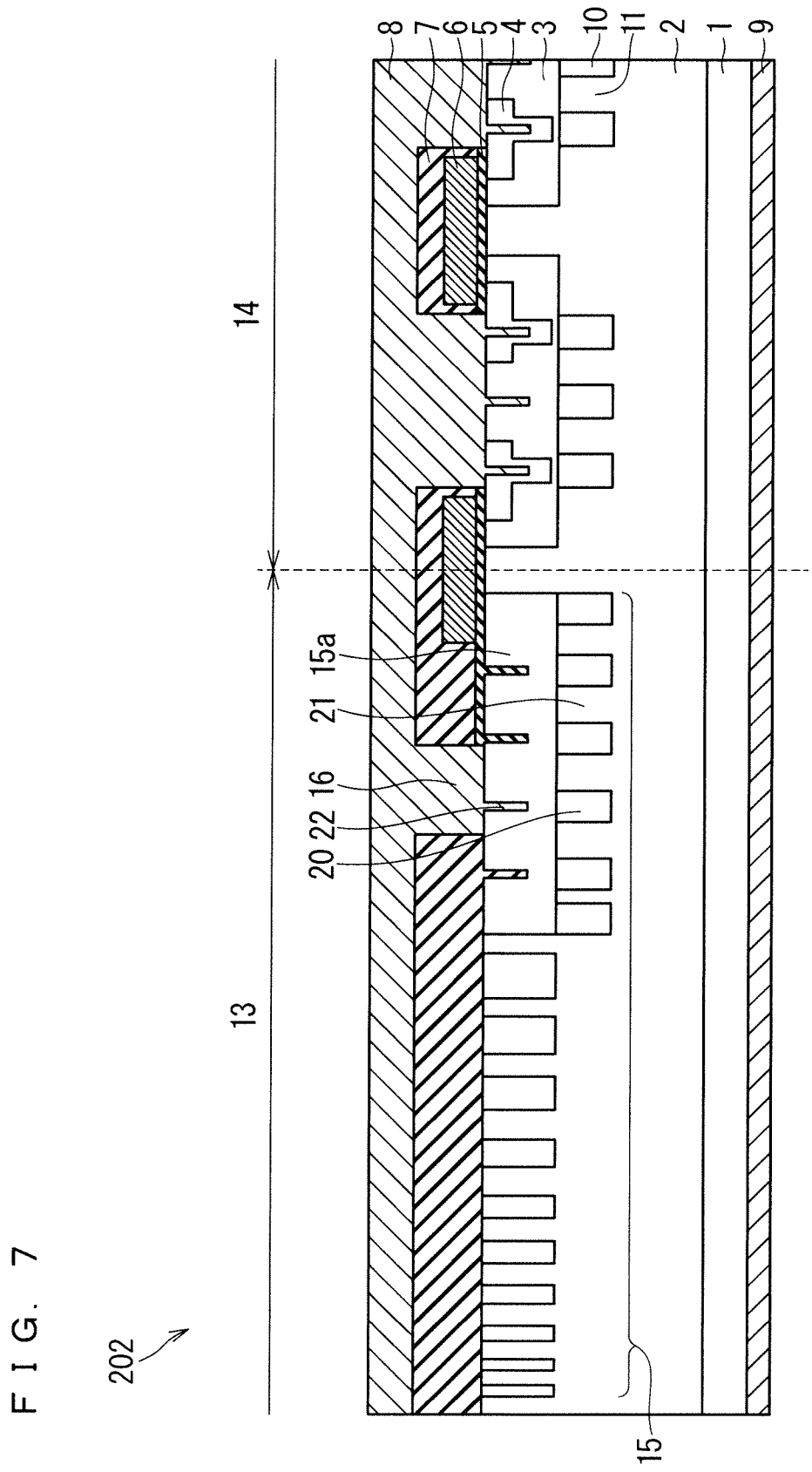
FIG. 7 is a cross-sectional view of an SiC-MOSFET according to a first modification example of the embodiment 2.

FIG. 7 is a cross-sectional view of an SiC-MOSFET 202 according to a first modification example of the embodiment 2. The SiC-MOSFET 202 is different from the SiC-MOSFET 201 according to the embodiment 2 in that the concave portion 12 is formed in the upper surface of the source region 4 in the active region 14 and the source contact portion of the base region 3 and the concave portion 22 is formed in the upper surface of the guard ring 15a on the innermost peripheral side in the outer peripheral region 13. The active region 14 of the SiC-MOSFET 202 has the same configuration as the SiC-MOSFET 102 according to the modification example of the embodiment 1. The gate insulating film 5, the interlayer insulating film 7, or the source electrode 8 is put into the concave portion 22.

Figure 8:
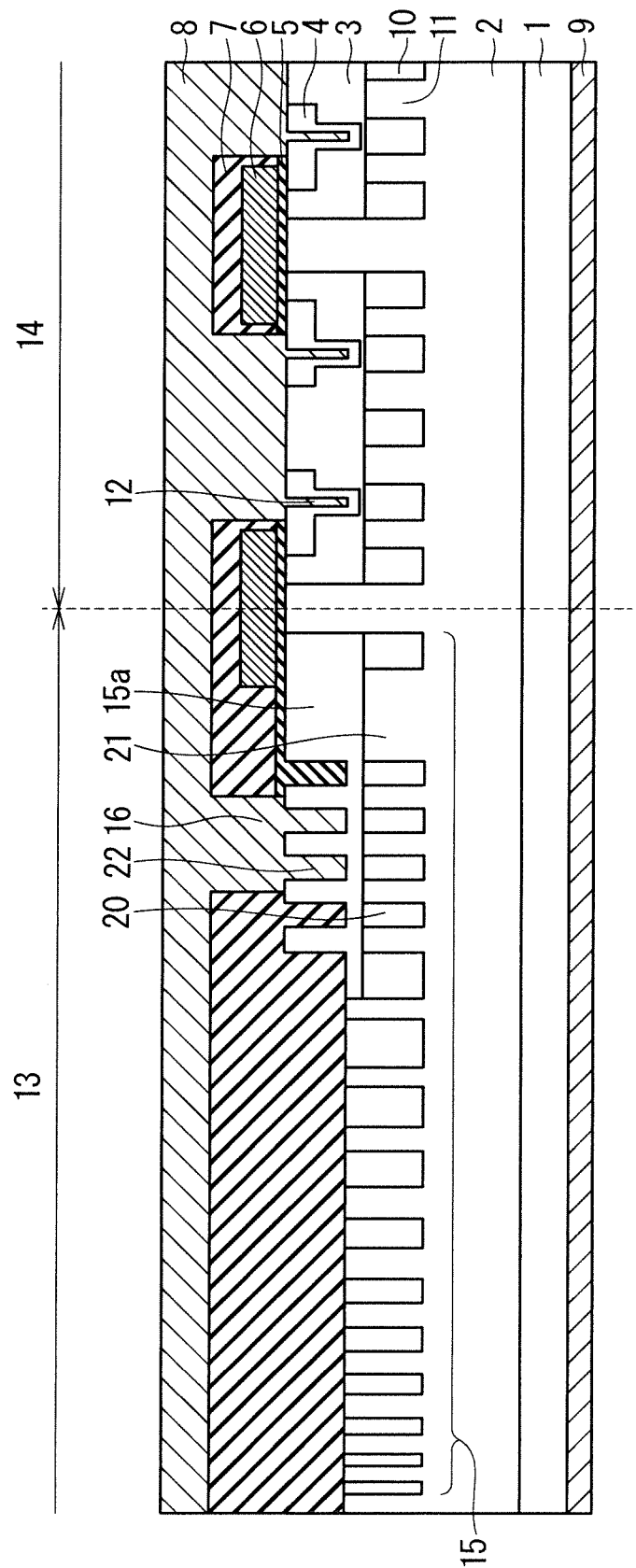
FIG. 8 is a cross-sectional view of an SiC-MOSFET according to a second modification example of the embodiment 2.

FIG. 8 is a cross-sectional view of an SiC-MOSFET 203 according to a second modification example of the embodiment 2. In the SiC-MOSFET 203, the width of the concave portion 22 is larger than that of the concave portion 22 in the SiC-MOSFET 202, and an upper surface of an outer end portion of the guard ring 15a and an upper surface of the guard ring 15 on an outer side of the guard ring 15a coincide with a height of a bottom surface of the concave portion 22.

A planar-type unit cell is used in the SiC-MOSFETs 101, 102, 201, 202, and 203 described above, however, a trench-type unit cell may also be used.

B-4. Effect

The SiC-MOSFET 201 according to the embodiment 2 includes the active region 14 in which the plurality of unit cells made up of the gate electrode 6, the base region 3, and the source region 4 are disposed and the outer peripheral region 13 surrounding the active region 14. The outer peripheral region 13 includes the plurality of guard rings 15 of the second conductivity type formed in the surface layer of the drift layer 2 and the plurality of second embedded regions 20 of the second conductivity type formed adjacent to the lower surface of the guard ring 15a on the innermost peripheral side of the plurality of guard rings 15. The plurality of second embedded regions 20 are formed adjacent to at least the lower surface of both end portions of the guard ring 15a on the innermost peripheral side, and three or more second embedded regions 20 are formed to be separated from each other. Thus, according to the SiC-MOSFET 201, the body diode current which can flow without the occurrence of the fault extension can be increased also in the outer peripheral region 13.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:
1. An SiC-MOSFET, comprising:
   an SiC substrate of a first conductivity type;
   a drift layer of a first conductivity type formed on the SiC substrate;
   a base region of a second conductivity type formed on a surface layer of the drift layer;

a source region of a first conductivity type formed on a surface layer of the base region;
a gate electrode facing a channel region which is a region of the base region sandwiched between the drift layer and the source region via a gate insulating film;
a source electrode having electrical contact with the source region; and
a plurality of first embedded regions of a second conductivity type formed adjacent to and directly contacting a lower surface of the base region, wherein
two of the plurality of first embedded regions are respectively positioned immediately below outermost opposing end portions of the base region such that each of the two of the plurality of first embedded regions has a side substantially vertically aligned with one of the outermost opposing end portions of the base region, and
three or more of the plurality of first embedded regions are formed to be separated from each other.

2. The SiC-MOSFET according to claim 1, wherein a width of the drift layer sandwiched between adjacent ones of the plurality of first embedded regions is equal to or larger than 0.4 µm and equal to or smaller than 4.0 µm.

3. The SiC-MOSFET according to claim 1, wherein a ratio of a depth of each of the first embedded regions to a depth of the base region is equal to or larger than 1.2.

4. The SiC-MOSFET according to claim 1, wherein the plurality of first embedded regions are disposed at regular intervals.

5. The SiC-MOSFET according to claim 1, wherein a width of at least one of the two first embedded regions located immediately below a respective one of the outermost opposing end portions of the base region is larger than a width of one of the first embedded regions which is not located immediately below one of the outermost end portions of the base region.

6. The SiC-MOSFET according to claim 1, wherein a depth of one of the first embedded regions located immediately below one of the outermost opposing end portions of the base region is equal to a depth of one of the first embedded regions which is not located immediately below one of the outermost opposing end portions of the base region.

7. A SiC-MOSFET, comprising:
an SiC substrate of a first conductivity type;
a drift layer of a first conductivity type formed on the SiC substrate;
a base region of a second conductivity type formed on a surface layer of the drift layer;
a source region of a first conductivity type formed on a surface layer of the base region;
a gate electrode facing a channel region which is a region of the base region sandwiched between the drift layer and the source region via a gate insulating film;
a source electrode having electrical contact with the source region;
a plurality of first embedded regions of a second conductivity type formed adjacent to a lower surface of the base region;
an active region in which a plurality of unit cells made up of the gate electrode, the base region, and the source region are disposed; and
an outer peripheral region surrounding the active region, wherein
two of the plurality of first embedded regions are respectively positioned immediately below outermost end portions of the base region, and
three or more of the plurality of first embedded regions are formed to be separated from each other,
the outer peripheral region includes:
  a plurality of guard rings of a second conductivity type formed on the surface layer of the drift layer; and
  a plurality of second embedded regions of a second conductivity type formed adjacent to a lower surface of a guard ring on an innermost peripheral side of the plurality of guard rings,
the plurality of second embedded regions are adjacent to at least a lower surface of both end portions of the guard ring on the innermost peripheral side, and
the three or more second embedded regions are formed to be separated from each other.

8. The SiC-MOSFET according to claim 7, wherein a depth of each of the first embedded regions and a depth of each of the second embedded regions are equal to each other.

9. The SiC-MOSFET according to claim 7, wherein a width of the drift layer sandwiched between the two of the plurality of first embedded regions adjacent to each other is equal to or larger than 0.4 µm and equal to or smaller than 4.0 µm.

10. The SiC-MOSFET according to claim 7, wherein a ratio of a depth of each of the first embedded regions to a depth of the base region is equal to or larger than 1.2.

11. The SiC-MOSFET according to claim 7, wherein the plurality of first embedded regions are disposed at regular intervals.

12. The SiC-MOSFET according to claim 7, wherein a width of at least one of the two first embedded regions located immediately below a respective one of the outermost end portions of the base region is larger than a width of one of the first embedded regions which is not located immediately below one of the outermost end portions of the base region.

13. The SiC-MOSFET according to claim 7, wherein a depth of one of the first embedded regions located immediately below the both end portions of the base region is equal to a depth of one of the first embedded regions which is not located immediately below the both end portions of the base region.

* * * * *